US009471138B2

(12) United States Patent
Strijker

(10) Patent No.: US 9,471,138 B2
(45) Date of Patent: Oct. 18, 2016

(54) SWITCHED MODE POWER SUPPLY, A CONTROLLER THEREFOR, A LIGHTING CIRCUIT AND A CONTROL METHOD

(71) Applicant: NXP B.V., Eindhoven (NL)

(72) Inventor: Joan Wichard Strijker, Nijmegen (NL)

(73) Assignee: NXP B.V., Eindhoven (NL)

( * ) Notice: Subject to any disclaimer, the term of this patent is extended or adjusted under 35 U.S.C. 154(b) by 36 days.

(21) Appl. No.: 14/728,929

(22) Filed: Jun. 2, 2015

(65) Prior Publication Data

US 2016/0018876 A1    Jan. 21, 2016

(30) Foreign Application Priority Data

Jul. 17, 2014  (EP) .................................... 14177479

(51) Int. Cl.
| | |
|---|---|
| *H02M 3/156* | (2006.01) |
| *G06F 1/32* | (2006.01) |
| *H02M 1/36* | (2007.01) |
| *H03K 17/16* | (2006.01) |
| *H05B 33/08* | (2006.01) |

(Continued)

(52) U.S. Cl.
CPC ........... *G06F 1/3287* (2013.01); *G06F 1/3243* (2013.01); *H02M 1/36* (2013.01); *H02M 3/155* (2013.01); *H03K 17/16* (2013.01); *H05B 33/0839* (2013.01); *H03K 17/107* (2013.01); *H03K 2217/0081* (2013.01)

(58) Field of Classification Search
CPC .... H02M 3/156; H02M 3/158; H02M 3/155; H02M 3/157; G05F 1/56

USPC ................ 323/271, 273, 282, 283, 284, 351
See application file for complete search history.

(56) References Cited

U.S. PATENT DOCUMENTS

| | | | | |
|---|---|---|---|---|
| 8,487,546 | B2 * | 7/2013 | Melanson | .......... H05B 33/0839 315/291 |
| 8,674,605 | B2 * | 3/2014 | Puvanakijjakorn | H05B 33/0809 315/200 R |

(Continued)

FOREIGN PATENT DOCUMENTS

EP     2 787 639 A1   10/2014

OTHER PUBLICATIONS

Cirrus Logic, Inc. "CRD1615A-BW 8 Watt Reference Design", pp. 1-21, retrieved from the Internet at: http://www.cirrus.com/en/pubs/rdDatasheet/CRD1615A-8W_RD2.pdf (Aug. 2013).

(Continued)

*Primary Examiner* — Adolf Berhane

(57) ABSTRACT

A switched mode power supply for converting an input voltage and comprising: a series arrangement of an inductor, a power switch and a control switch for controlling the power switch; a controller configured to control the control switch and having a supply terminal and a ground terminal; a capacitor coupled between the controller ground terminal and supply terminal and for providing power to the controller; a first current path arranged to provide charge to the capacitor only when the control switch is open and the power switch is closed; a connectable second current path arranged to draw current from the control terminal of the power switch thereby opening the power switch, and a connection switch configured to connect the second current path in response to a voltage across the capacitor exceeding a threshold voltage. A controller, lighting circuit and corresponding method are also disclosed.

15 Claims, 13 Drawing Sheets

(51) Int. Cl.
*H02M 3/155* (2006.01)
*H03K 17/10* (2006.01)

(56) References Cited

U.S. PATENT DOCUMENTS

| | | | | |
|---|---|---|---|---|
| 2006/0132111 A1* | 6/2006 | Jacobs | ............... | G05F 1/618 323/282 |
| 2010/0309689 A1 | 12/2010 | Coulson | | |
| 2011/0199796 A1 | 8/2011 | Wu et al. | | |
| 2013/0343101 A1 | 12/2013 | Zhang et al. | | |
| 2014/0117867 A1* | 5/2014 | Elferich | ............ | H05B 33/0815 315/201 |
| 2014/0125241 A1* | 5/2014 | Elferich | ............ | H05B 33/0815 315/200 R |
| 2015/0036389 A1* | 2/2015 | Freeman | ............ | H02M 1/10 363/16 |
| 2015/0295494 A1* | 10/2015 | Gong | ............ | H05B 33/0815 315/224 |

OTHER PUBLICATIONS

"Bipolar Transistor", pp. 291-323, retrieved from the Internet at: http://www.eecs.berkeley.edu/~hu/Chenming-Hu_ch8.pdf (Feb. 13, 2009).

Extended European Search Report for EP Patent Appln. No. 14177479.4 (Jan. 26, 2015).

* cited by examiner

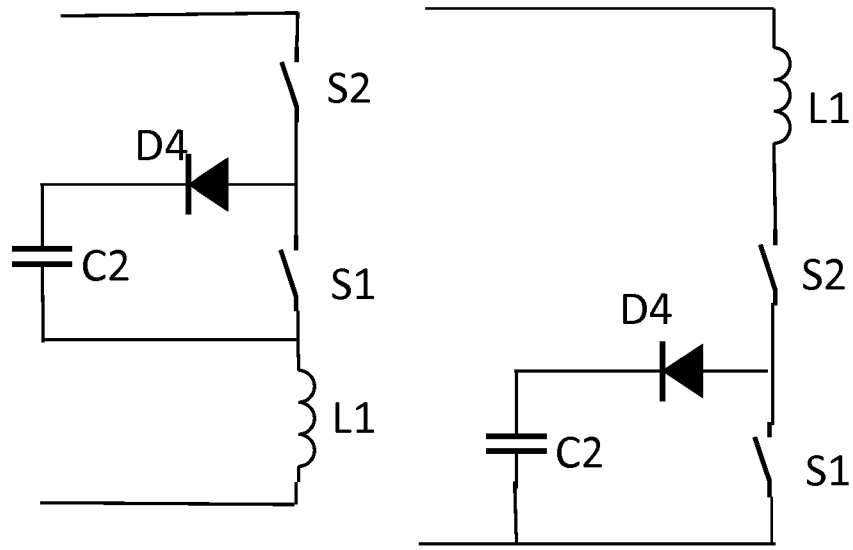
*FIG. 14a*　　　　　*FIG. 14b*
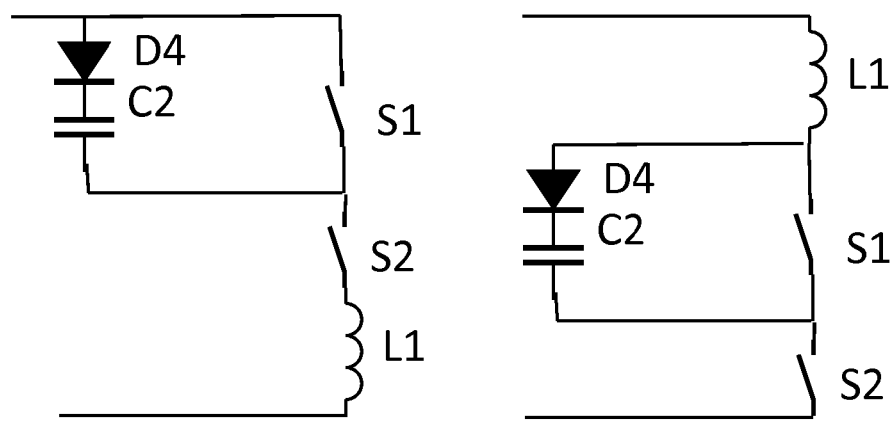
*FIG. 14c*　　　　　*FIG. 14d*

SWITCHED MODE POWER SUPPLY, A CONTROLLER THEREFOR, A LIGHTING CIRCUIT AND A CONTROL METHOD

CROSS-REFERENCE TO RELATED APPLICATIONS

This application claims the priority under 35 U.S.C. §119 of European patent application no. 14177479.4, filed on Jul. 17, 2014, the contents of which are incorporated by reference herein.

FIELD

This disclosure relates to switched mode power supplies (SMPS) and controllers therefor, to lighting circuit comprising such SMPS, and to methods for controlling switched mode power supplies.

BACKGROUND

In some designs of SMPS, the switching element comprises separate but series-connected power switch and control switches. This is currently most frequently the case, and often may be necessary, in designs in which the power switch is a high-voltage bipolar junction transistor. However it should be mentioned at the outset, that a separate power switch and control switch may also be used in designs in which the power switch is a high-voltage MOSFET. Since separate control and power switches are most commonly used with bipolar junction transistors, designs utilising these two switches are often loosely referred to as emitter switched converters. Relative to high-voltage MOSFETs, high-voltage bipolar devices may be significantly cheaper, but since they suffer the drawback of low voltage amplification, they typically require a large base driver current.

Switched mode power supplies are typically operated under the control of a controller, which controls the timing of the switching of the switching element. In the case of emitter switched converters the switching element may switch the control switch, and the power switch is arranged and configured to switch following the operation of the control switch.

A schematic of a SMPS connected to an AC mains 120 through rectifier B1 and input smoothing capacitor C1, and driving LEDs is shown in FIG. 1. In this case the SMPS is a buck converter. The converter comprises a series arrangement of a control switch S1, a power switch S2, and an inductor L1. In this arrangement, the load, which is shown as a series string of LEDs is connected in series with the inductor L1. As shown, power switch S2 is a bipolar transistor which requires a relatively high base current. In order to provide this base current for the power switch S2, the base terminal of the switch S2 is connected to the smoothed rectified mains input through a resistor R1 and a parallel arrangement of a diode D3 and a resistor R4. The value of resistor R4 is chosen so as to set the required appropriate base current for the power switch S2, and diode D3 is provided so as to ensure that S2 can be switched off quickly. The SMPS comprises a controller 110 which has a supply terminal 114 and ground terminal 112. A capacitor C2 is connected across these terminals to provide a supply voltage Vcc to the controller 110. Also shown is a sense resistor R2 which is connected to the controller and used to sense the current through the inductor in order to control the switching.

As soon as Vcc rises above the start-up voltage, the controller starts switching. However, typically a switching mode power supply controller consumes more supply current in switching state than in non-switching state. For example additional supply current is needed to drive the power switch. When the current through R1 is just enough to charge C2 to the start-up voltage level (Vstart), it may not be enough to supply the SMPS during operation. The supply voltage would then drop and could reach a voltage level were the SMPS cannot work properly anymore. Typically an under-voltage-lock-out voltage (Vstop) is therefore implemented that stops the operation of the SMPS. As soon as the SMPS stops operating, the supply current of the controller drops again, and the capacitor is able to recharge to the start-up voltage level, which will then repeat the situation were the SMPS starts and stops.

To prevent this on and off operation, a take-over supply, comprising diode D2 and resistor R3 is added to provide additional current as soon as the converter starts switching and the LED voltage rises above the Vcc level. Alternatively, for flyback converters, an auxiliary winding on the primary side of the transformer may be included to provide power to the controller, once the SMPS is in operation.

SUMMARY

According to a first aspect, there is provided a switched mode power supply for converting an input voltage and comprising: a series arrangement of an inductor, a power switch and a control switch for controlling the power switch; a controller configured to control the control switch and having a supply terminal and a ground terminal; a capacitor coupled between the controller ground terminal and supply terminal and for providing power to the controller; a first current path arranged to provide charge to the capacitor only when the control switch is open and the power switch is closed; a connectable second current path arranged to draw current from the control terminal of the power switch thereby opening the power switch, and a connection switch configured to connect the second current path in response to a voltage across the capacitor exceeding a threshold voltage.

By separating in time the occurrence of opening the control switch, and opening the power switch, charge may be provided to the capacitor, from the input (such as a rectified mains). In embodiments in which the capacitor is used to power the controller, it may be possible to thereby avoid the need for an auxiliary power supply for the controller.

In one or more embodiments, the power switch is a bipolar junction transistor and the current drawn from the control terminal of the power switch is provided by a base charge of the transistor in an on-state. In arrangements where the control switch is separated from the power switch, it is most common to use a bipolar transistor since they generally may be less expensive than MOSFETs. The base charge in a bipolar transistor is generally much higher than any charge on the gate of a MOSFET. In one or more embodiments, the switched mode power supply further comprises a further current path through the base of the power switch thereby enabling a start-up of the switched mode power supply. In one or more other embodiments, the power switch is a MOSFET.

In one or more embodiments the second current path is a recycling path arranged to draw current from the control terminal of the power switch to charge the capacitor. Particularly in the case that the power switch is a bipolar transistor, the base charge may be relatively high, and thus by recycling this charge to charge the capacitor, it might be possible to achieve a significant increase in efficiency of the circuit.

In one or more embodiments, the switched mode power supply further comprises a current path between the power switch control terminal and a positive terminal of the input voltage, which may be a rectified mains.

In one or more embodiments, the current path arranged to provide charge to the capacitor when the power switch is closed comprises a diode.

The switched mode power supply may be a buck converter and be arranged for connection of a load in series with the series arrangement. Alternatively and without limitation, the switched mode power supply may be a boost converter and be arranged for connection of a load in parallel with the control switch and power switch in series. Yet further and again without limitation, the switched mode power supply may be a flyback converter wherein the inductor is a primary winding of a transformer, and the switch mode power supply is arranged for connection of a load to a secondary winding of the transformer.

According to another aspect there is provided a lighting circuit comprising a switch mode power supply has described above, and the load, wherein the load is a string of LEDs. The input voltage may be smoothed rectified mains supply.

According to a yet further aspect, there is provided a method of controlling a switched mode power supply comprising a series arrangement of a power switch, a control switch and an inductor, the arrangement being connected across a positive and a negative terminal of an input voltage, such as for example a rectified and smoothed mains; a controller having a supply terminal and a ground terminal; and a capacitor coupled between a ground terminal and a supply terminal of the controller and for providing power to the controller; the method comprising; operating the controller to periodically open and close the control switch; providing charge to the capacitor through a first current path only when the control switch is open and the power switch is closed; and in response to a voltage across the capacitor exceeding a threshold voltage, operating a connection switch to connect a second path thereby drawing current from the control terminal of the power switch thereby opening the power switch.

In one or more embodiments, the power switch is a bipolar junction transistor, and drawing current from the control terminal of the power switch discharges a base charge of the transistor in an on-state.

In one or more embodiments, the current drawn from the control terminal of the power switch is used to charge the capacitor.

One or more embodiments further comprise providing a start-up current to the control terminal of the power switch during a start-up phase of the switched mode power converter, thereby providing start-up energy to the capacitor.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which

FIGS. 14a-14d illustrate example arrangements of a power switch, control switch, and inductor, and with associated current paths for charging a capacitor.

Figure 1:
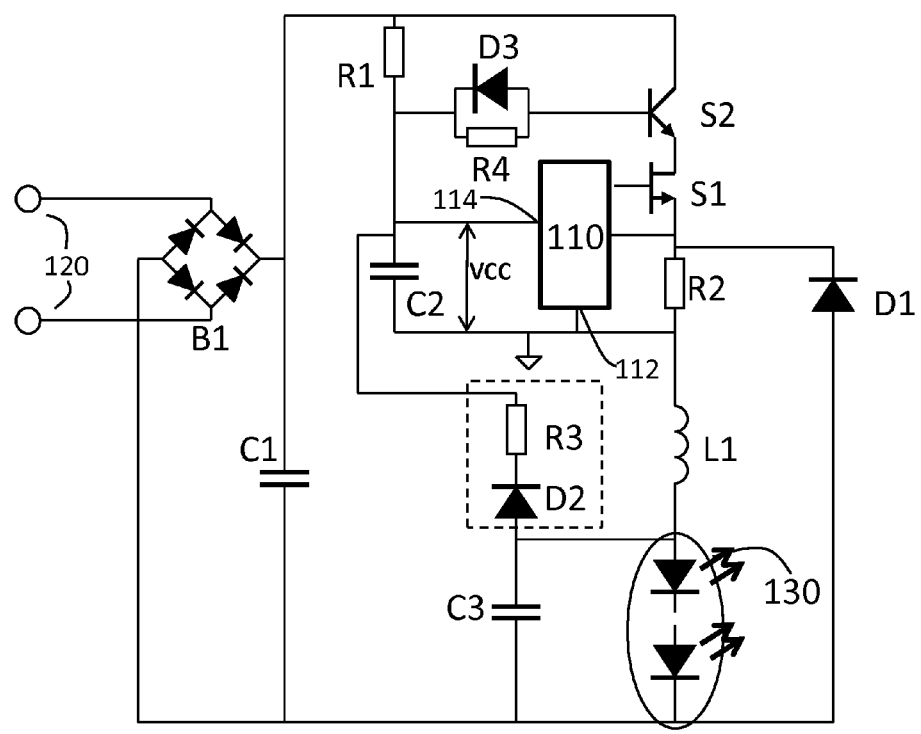
FIG. 1 shows a schematic of a lighting circuit of a SMPS connected to an AC mains and driving a lighting circuit.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

Figure 2:
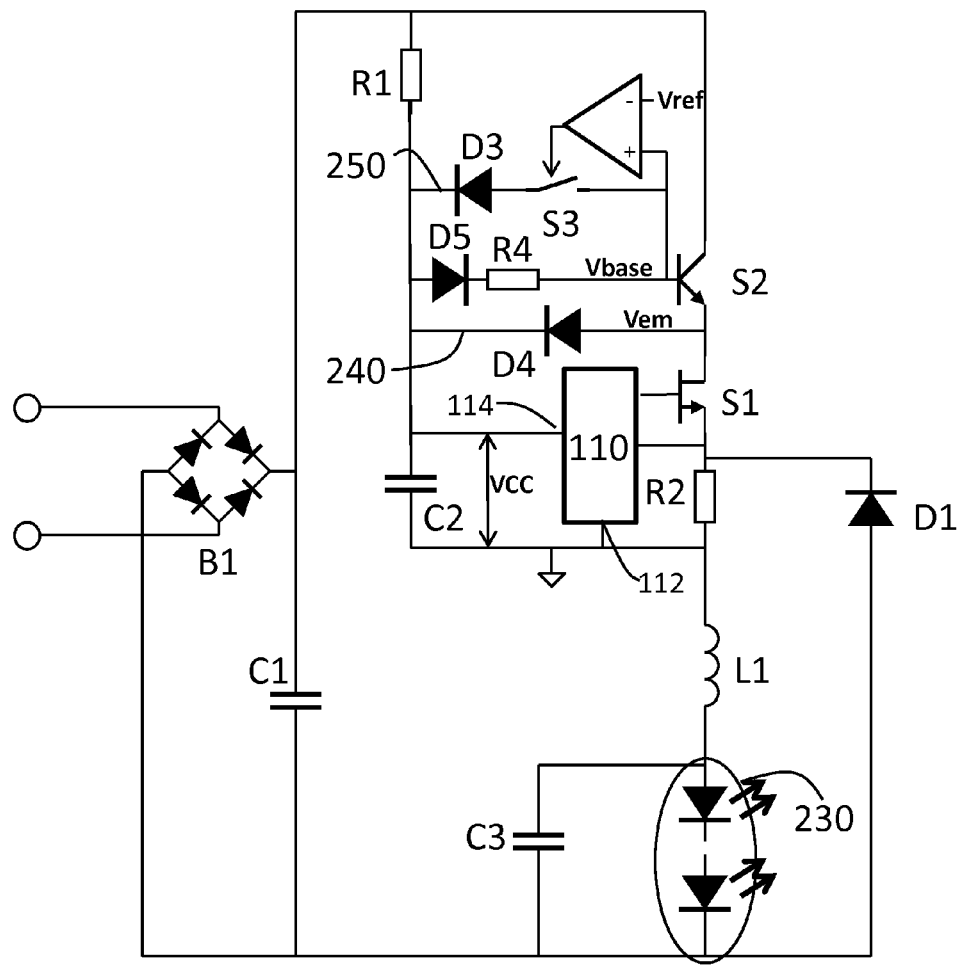
FIG. 2 illustrates a lighting circuit according to embodiments.

FIG. 2 shows a switched mode power supply according to embodiments, for converting an input voltage. The SMPS, which may also be referred to as a switched mode power converter, comprises: a series arrangement of an inductor L1, a power switch S2, a control switch S1 for controlling the power switch; a controller 110 configured to control the control switch and having a supply terminal 112 and a ground terminal 114; a capacitor C2 coupled between the controller ground terminal and supply terminal and for providing power to the controller; a first current path 240 arranged to provide charge to the capacitor only when the control switch is open and the power switch is closed; a connectable second current path 250 arranged to draw current from the control terminal of the power switch thereby opening the power switch, and a connection switch S3 configured to connect the second current path in the event that, or in response to, a voltage across the capacitor exceeds a threshold voltage.

In the schematic of FIG. 2, the SMPS is shown to be connected to the AC mains through rectifier B1 and input smoothing capacitor C1, and drives a string of LEDs 230. The converter comprises a series arrangement of a control switch S1, a power switch S2, and an inductor L1 (not necessarily in that order). The string of LEDs comprises the load, and is connected in series with the inductor L1. The controller 110 has supply and ground terminals 114, 112. Capacitor C2 is connected across these terminals and provides a supply voltage Vcc to the controller 110. Also shown is a sense resistor R2 which is connected to the controller and used to sense the current through the inductor in order to control the switching. Power switch S2 is shown as a bipolar transistor. The skilled person will be familiar that a sense resistor may not be required in embodiments in which other means are used to determine the appropriate switching moment of the control or power switches. To provide base current for the power switch S2 at start-up (which will be considered in more detail below), its base terminal is connected to the smoothed rectified mains input through resistor R1. During normal operation, current is provided to the base through R4. A relatively small amount of current may also be provided through R1—in a typical example, the base current is more than 10 mA, and R4 thus has to be able to supply this magnitude of current, whereas the value of R1 may be chosen to be able to supply only 1 mA or less. Discharging of the base charge through R4 when the power switch is open, is prevented by a diode D5; however, when the power switch is closed but the control switch is open, current can flow through D4, which thus is in the first current path, to charge the capacitor C2. The connectable current path, through which the base charge may discharge, is provided through diode D3 which connects the base terminal of the power switch to C2 via a switch S3. The connection status of this second current path is thus determined by the closed/open status of switch S3. Switch S3 may therefore be described as a connection switch. The status of this connection switch may be determined, as shown in these embodiments, by a comparator 220, which compares the voltage at the base of the power switch with a threshold voltage.

The value of R4 is chosen to provide the required level of base current for the power switch S2: For a typical high voltage bipolar transistor the current amplification can typically be as low as 12, so if the peak current through S1, S2, L1 needs to be 144 mA, the base current needs to be at least 144 mA/12=12 mA. So if Vcc=13V, R4 needs to be about:

$$\frac{(13 - Ube(S2) - U(R2))}{12} \cdot \frac{V}{mA} = \frac{(13 - 0.7 - 1)V}{12\ mA} = 942\ ohm$$

Where Ube(S2) is the base emitter voltage across the power switch S2, and U(R2) is the voltage across the resistor R2, and assuming that the voltage drop across S1 is small and the peak voltage across R2 is 1 Volt.

D3 provides for fast discharge of the bass charge, in both the known solution, and according to embodiments: a low ohmic return path is needed for quick turn-off and high efficiency. Absent the time-interval t1-t2, after time interval t0-t1 where the base current is 12 mA, time interval t2-t3 would immediately follow and the base current would be −144 mA. This current would come from the base of S2. This high current cannot flow through R4 as this would require 140 mA*942 ohm=132V across R4, so to discharge the base quickly D3 is added for recycling the base charge.

In operation, when S1 is switched on, S2 is switched on via its emitter. The base current for transistor S2 is supplied via D5 and R4. When S1 is switched off, initially S3 is open and S2 remains in a conductive state due to the base charge of S2. The current through S2 now flows through D4 to the capacitor C2. This recharges the Vcc capacitor C2. The Vcc voltage therefore increases. Also the emitter voltage, shown as Vem, and the base voltage, shown as Vbase, each increase as Vcc increases. As soon as the base voltage reaches the Vref voltage for the comparator 220, S3 is closed by the comparator. The base charge is then discharged to capacitor C2 via D3 and S2 switches to the off-state. D3 is shown in the figure to make clear that the current may be only in this direction.

Figure 3:
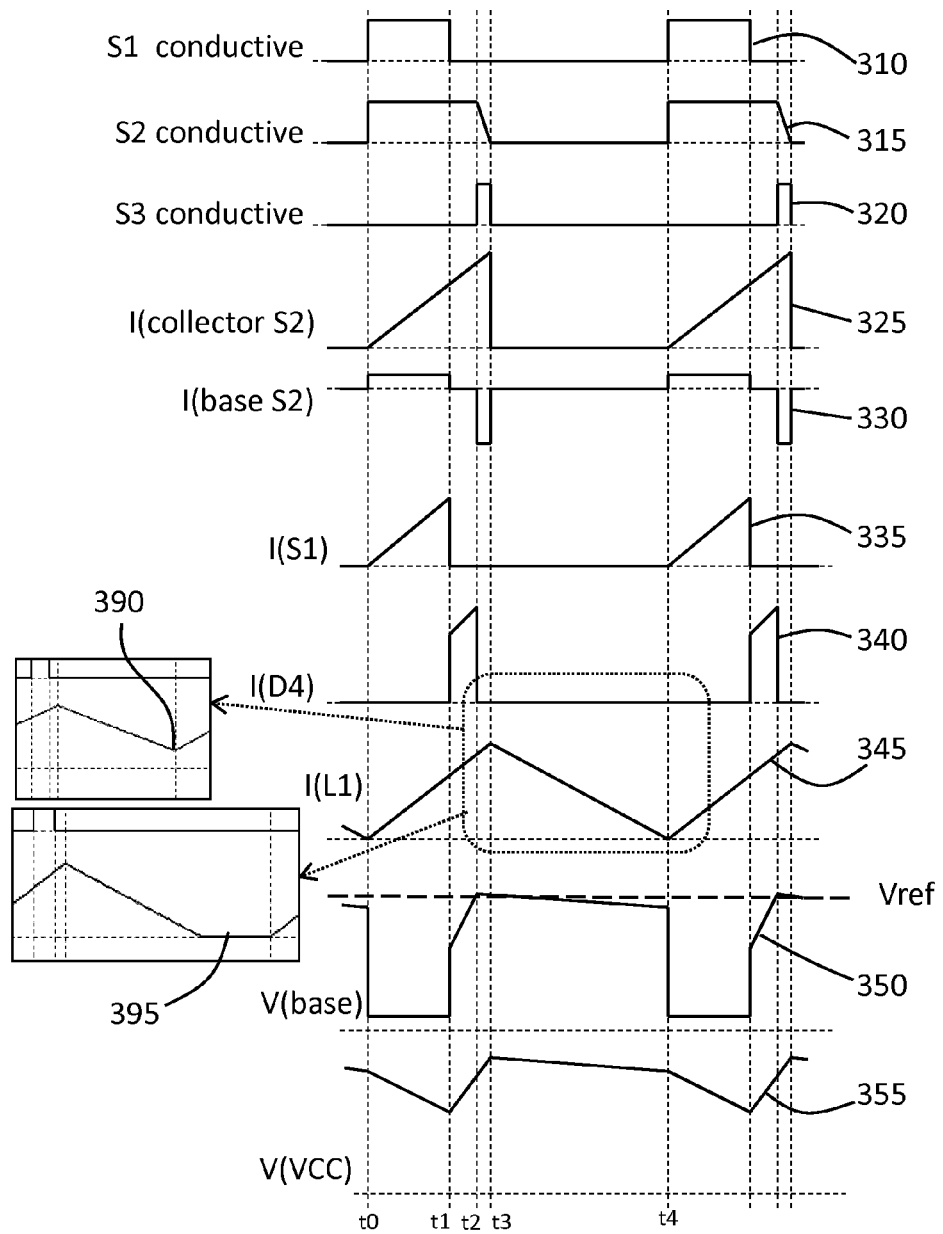
FIG. 3 shows various signals associated with the circuit of FIG. 2.

FIG. 3 shows various signals associated with the operation of a switched mode power supply as described above with reference to FIG. 2, over one-and-a-half switching cycles. Key moments in the switching cycles are shown at t0—both switches closed, t1—control switch S1 opens, t2—power switch S2 starts to open, and t3—power switch S3 completely open. t4 represents the start of a new cycle and is thus equivalent to t0. The figure shows, from the top: the conduction status 310 of control switch S1, the conduction status 315 of power switch S2, the conduction status 320 of connection switch S3, the collector current 325 in power switch S2, the base current 330 of power switch S2, the current 335 through control switch S1, the current 340 through diode D4, the current 345 through the inductor L1, the voltage 350 at the base of S2, and the voltage Vcc 355 at the capacitor C2.

At moment t0, control switch S1 is switched on by controller 110. Control switch S1 switches power switch S2 on via the emitter. The current in the switches and inductor L1 increases linearly. Due to the base current and also the controller supply current, the Vcc voltage drops. At moment t1, control switch S1 is switched off. The base (and emitter) voltage of power switch S2 rise until diode D4 starts conducting. The current then flows through diode D4, charging Vcc capacitor C2. The Vcc voltage, emitter voltage and base voltage rise until the base voltage reaches the reference voltage Vref at moment t2. Connection switch S3 is then closed and the base charge of power switch S2 is conducted to the capacitor C2 via connection switch S3 and diode D3. Once the base charge has been removed, shown at t3, power switch S2 is back in the non-conductive state. From t3 to t4 the stored energy in the inductor L1 is released in the LED output and C3. Diode D1 is the freewheeling diode of the converter.

It will be appreciated that the signals shown in FIG. 3 correspond to boundary mode conduction. That is to say, as soon as the inductor current 345 falls to 0, a new primary stroke starts. However, embodiments may also use either continuous conduction mode or discontinuous conduction mode. In continuous conduction mode, the inductor current does not return to zero, but the subsequent primary stroke starts earlier. This is shown at 390 in the upper cutaway section of FIG. 3. In discontinuous conduction mode, the inductor current returns to 0, and there is a subsequent gap before the next subsequent primary stroke commences. This gap is shown at 395 in the lower cutaway in FIG. 3.

Figure 4:
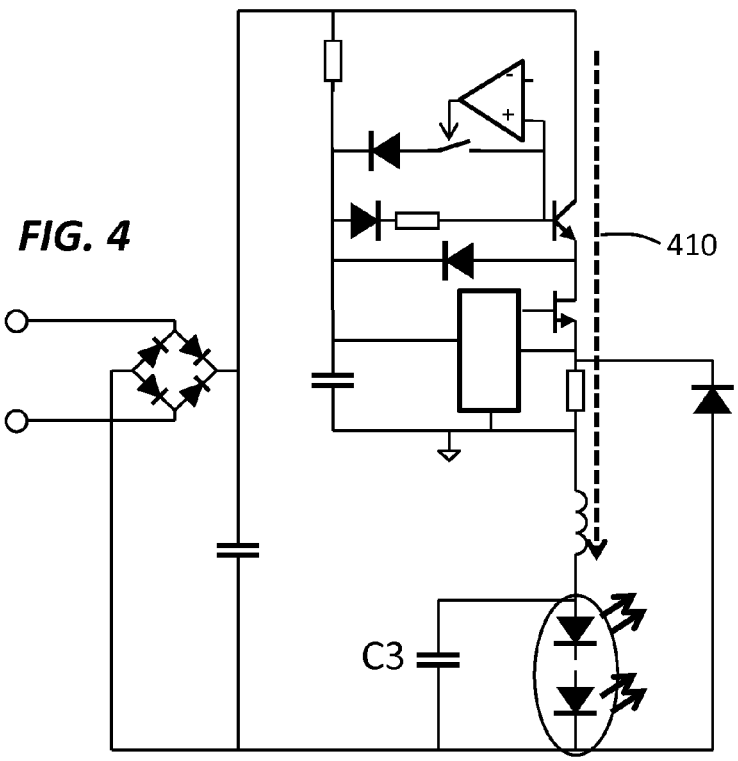
FIGS. 4-7 illustrate the current flow through the circuit of FIG. 2 during one-and-a-half switching cycles.
Figure 5:
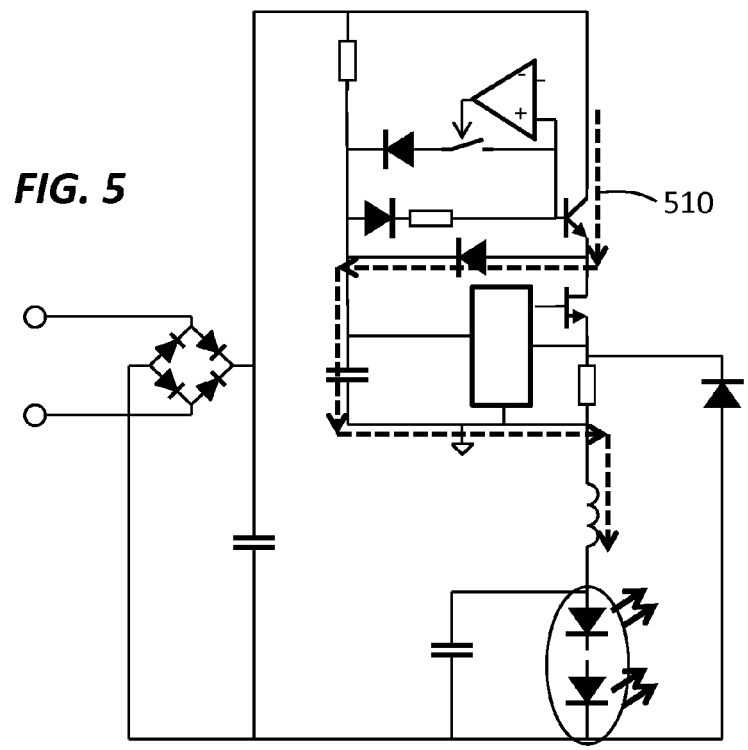
Figure 6:
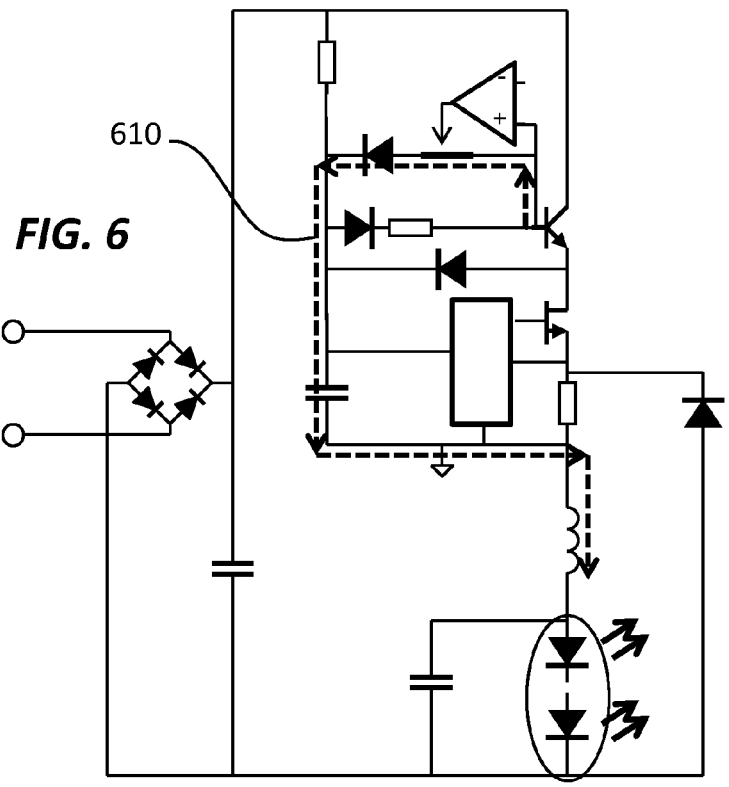
Figure 7:
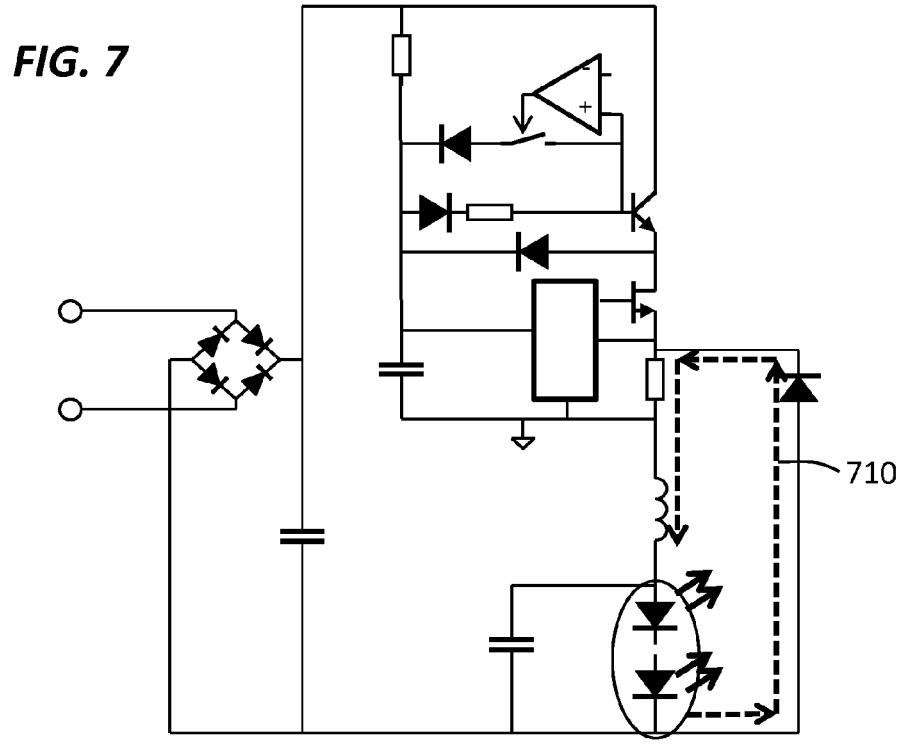

FIGS. 4-7 show the current flow through the circuit depicted in FIG. 2, at various times during the switching cycle:

FIG. 4 shows the current flow as dashed line 410 through the control and power switches S1 and S2 during interval t0-t1.

The arrangement according to embodiments enables charging of the capacitor C2 thereby providing power to the controller, during normal operation. This occurs during the period t1-2 shown in FIG. 3. This current flow is shown as dashed line 510 in FIG. 5. This is without the requirement for a separate auxiliary power supply (such as R3 and D2 shown in FIG. 1). It therefore may be possible to avoid the complexity and expense of a separate auxiliary power supply for the controller. In embodiments in which S2 is fully conductive in time interval t1-t2, this supply may be very efficient. It should be noted that this effect is not the same as a linear regulator: in particular, S2 does not operate in linear mode—which is the case for a linear regulator supplying an SMPS.

The supply voltage Vcc is regulated according to the Vref voltage: that is to say, as soon as Vcc exceeds V(ref), less the sum of the forward voltage U(D4) across D4 and the base-emited voltage (Vbe(S2)) of S2, S2 is switched off. If a larger load is present on node Vcc, S3 will be kept non-conductive for a longer time after moment t1. The time interval t1-t2 will then be extended. Also when the load on the Vcc node is small, the time interval t1-t2 will be small. Thus the arrangement operates in a self-regulating manner.

The stored base charge, during period t1-t2, enables the power switch S2 to remain closed during that time interval. Some embodiments also allow for recycling of this base charge as described above with reference to FIG. 2. This occurs during period t2-t3 shown in FIG. 3, and is depicted as dashed line 610 in FIG. 6 As shown in FIG. 2, this is done by connecting the connectable current path, in particular the blocking diode D3, to capacitor C2, to make use of the base charge. It will be apparent to the skilled person that that the diode D3 may be connected to any other suitable point in the circuit. However, it will be appreciated that the current coming out of the base during t2-t3 is very large. The peak base current will be as high as the collector current in that time interval. Recycling the base charge by discharging it to Vcc instead of discharging it to ground, thus may provide a significant increase in efficiency.

Finally, during period t3-t4, the switches S1 and S2 are both open, corresponding to the secondary stroke. Current is then delivered to the load through the fly-wheeling diode D1.

As will be discussed in more detail hereinbelow, in some embodiment a diode D3 may not be required, since the switch S3 is closed only at times when there is no risk of current flow in the "wrong" direction.

Figure 8:
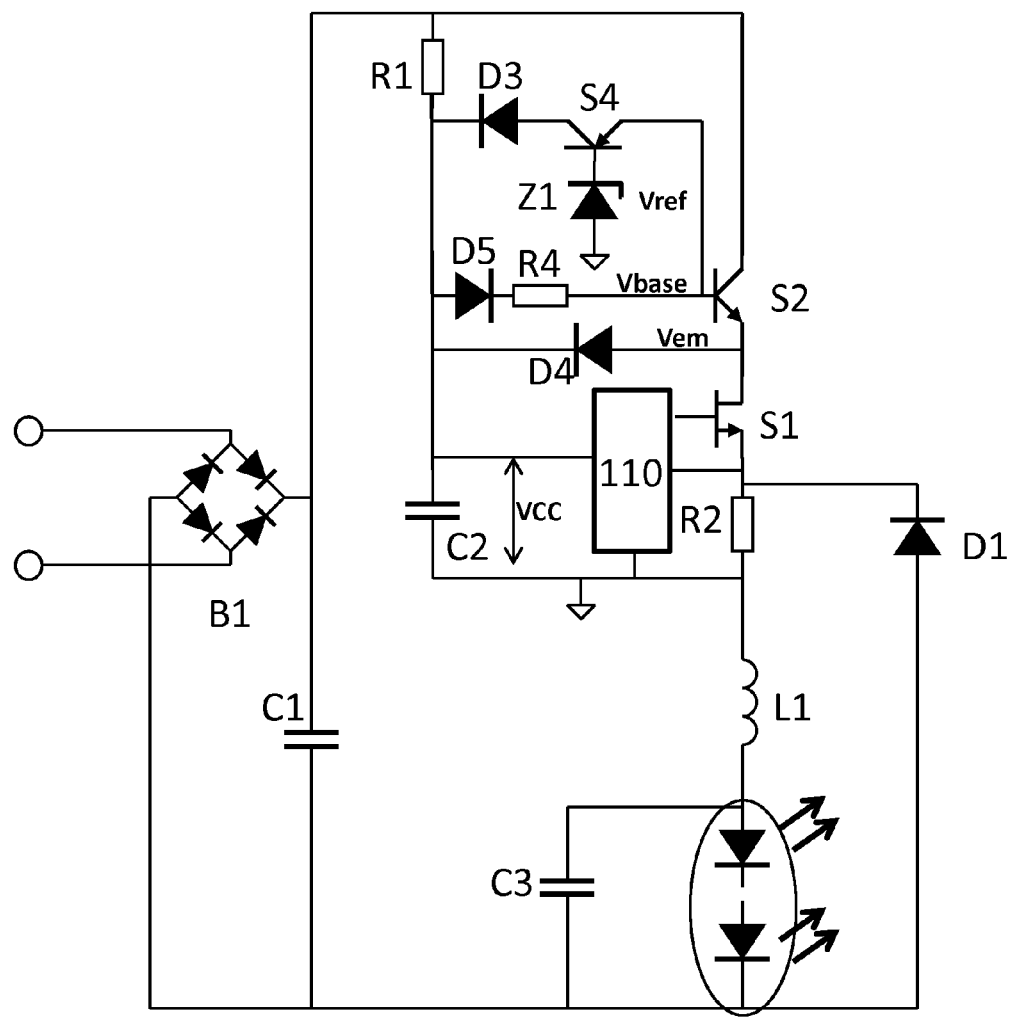
FIGS. 8-13 illustrate a switched mode power supply according to other embodiments.

FIG. 8 illustrates another embodiment according to the present disclosure. In this embodiment, the comparator 220 is replaced by a PNP switch S4 and a zener diode Z1, which provides the reference voltage Vref. The remainder of the circuit in this embodiment is similar to that shown in FIG. 2.

Figure 9:
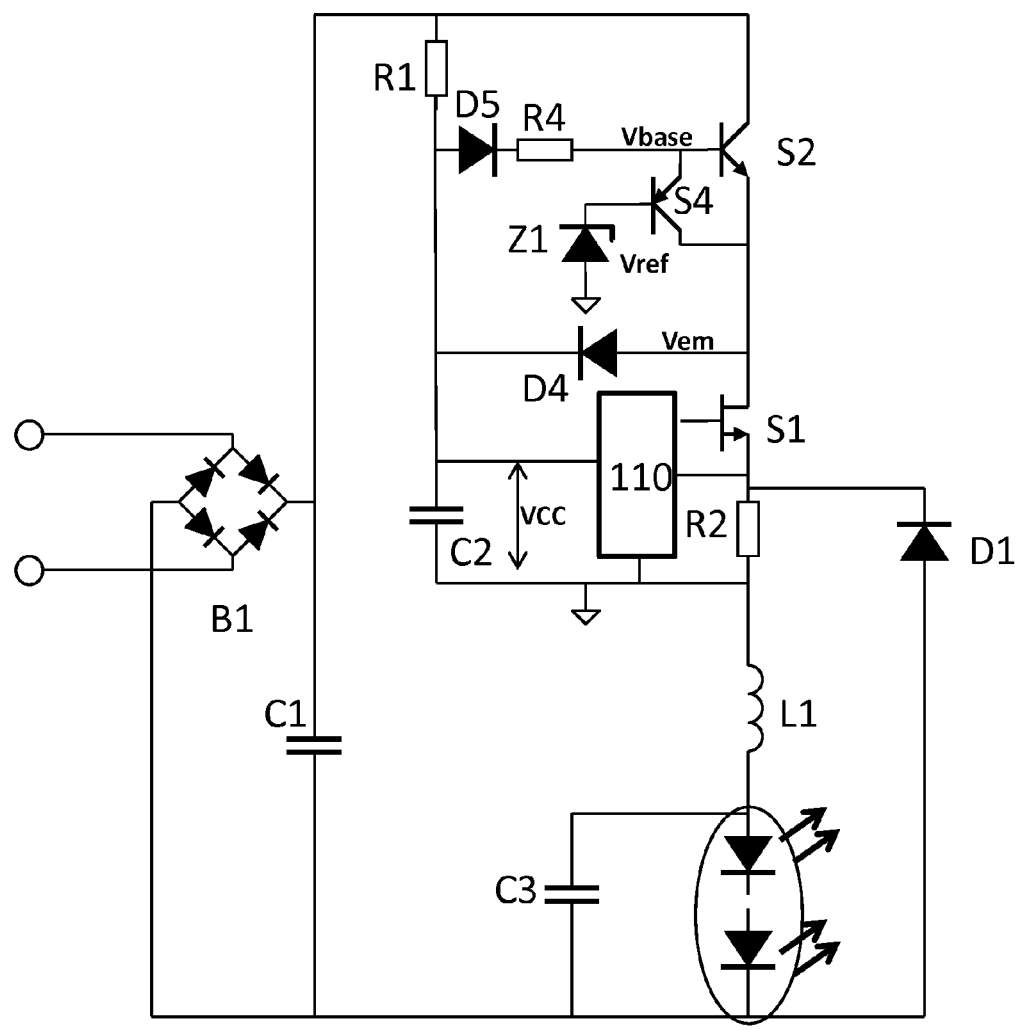

FIG. 9 illustrates yet another embodiment according to the present disclosure. This embodiment is similar to that shown in FIG. 8, with the exception that the connection switch S4 is re re-arranged such that its collector current is conducted by D4, thereby making diode D3 redundant, and reducing the component count relative to that shown in FIG. 8.

Figure 10:
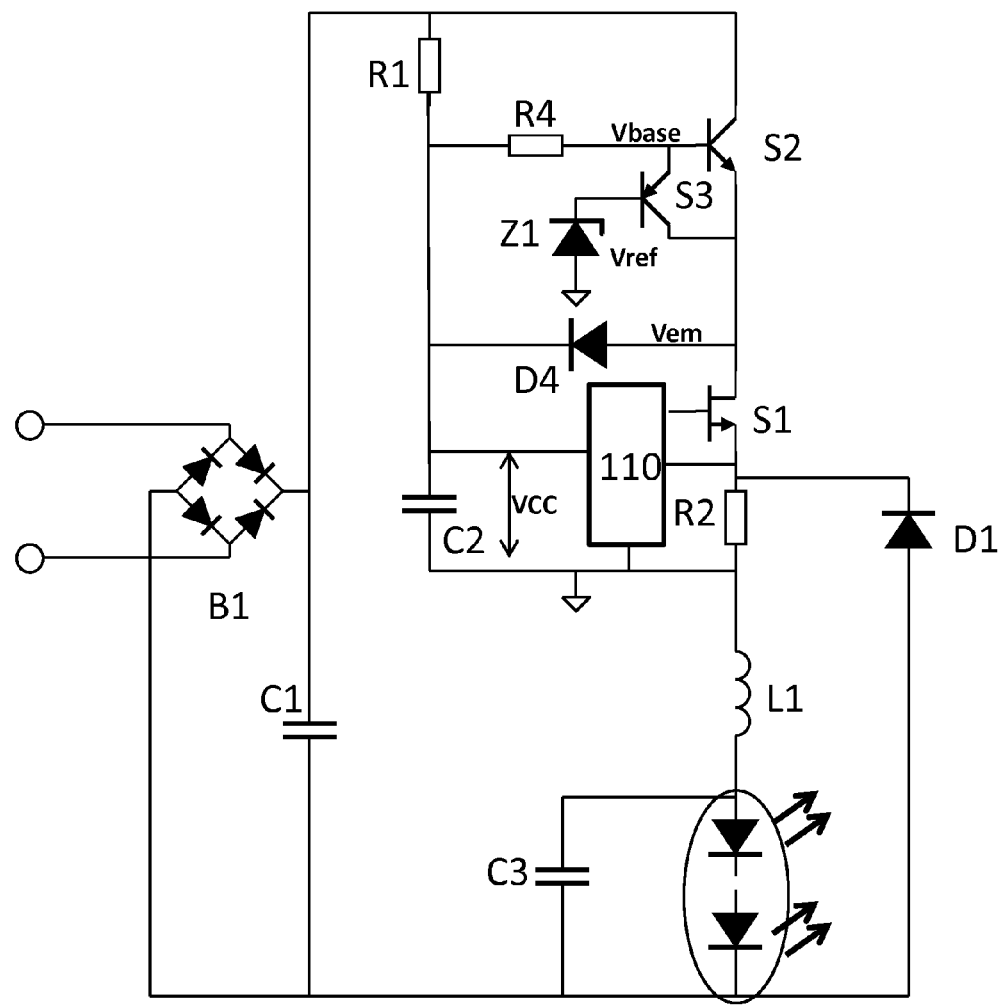

FIG. 10 illustrates a further embodiment according to the present disclosure. This embodiment is similar to that shown in FIG. 9, with the exception that blocking diode D5 has been eliminated: as has already been mentioned, and is shown in FIG. 3, in order to rapidly discharge the base of S2 in time interval t2-t3, a high current is required. As this current is typically much higher than the base current during time interval t0-t1, D5 can be left out without changing the performance significantly; R4 is relatively high ohmic for the base discharge current. For example, R4 may be in the range of 100Ω-1 kΩ, whereas the biasing resistor R1 may be typically be in the range of 100 kΩ-1 MΩ.

In the embodiment illustrated in FIG. 10 a small base discharge current will flow in time interval t1-t2. Because the current required to discharge the base is much higher, this current will hardly affect the performance, whereas it lowers the component count even further.

Figure 11:
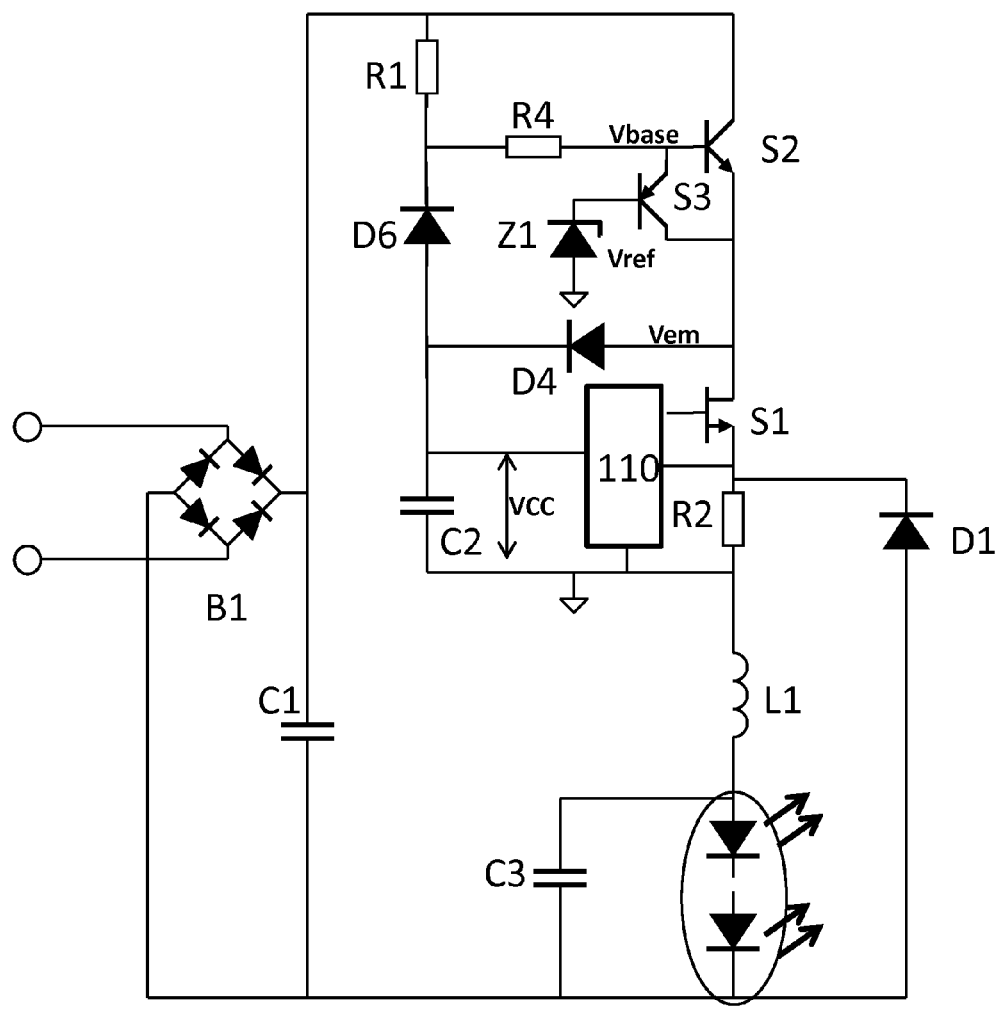

In embodiments in which the power switch is a bipolar junction transistor, this can be used to provide the power for start-up: FIG. 11 illustrates an embodiment in which this is put into effect. In this embodiment a further diode D6 is included which blocks current from resistor R1 directly charging capacitor C2; rather it directs the start-up current through R1 to the base of S2. This current is amplified by the current ratio of the bipolar transistor and the capacitor C2 is charged via D4. R1 can now be chosen to be even more high ohmic—typically in the range 1-10 MΩ, increasing the efficiency of the SMPS. During normal operation, in time interval t0-t1 D6 is conductive to provide S2 with base current coming from C2, while during time interval t1-t2 (and all other time intervals) D6 blocks the base discharge current. Thus, in exchange for a higher component count, this embodiment provides for start-up current, and may result in high-efficiency operation than may generally be expected, for instance, from embodiments such as that shown in FIG. 10.

Figure 12:
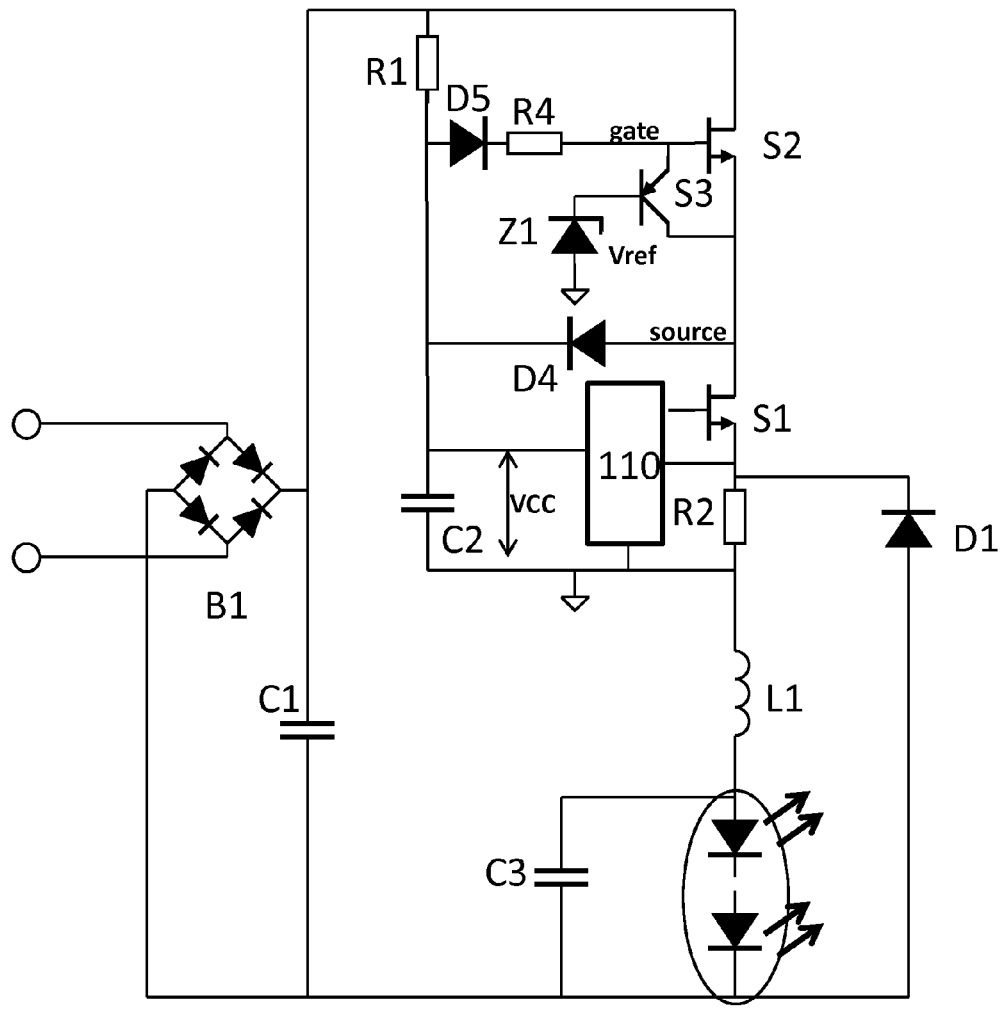
Figure 13:
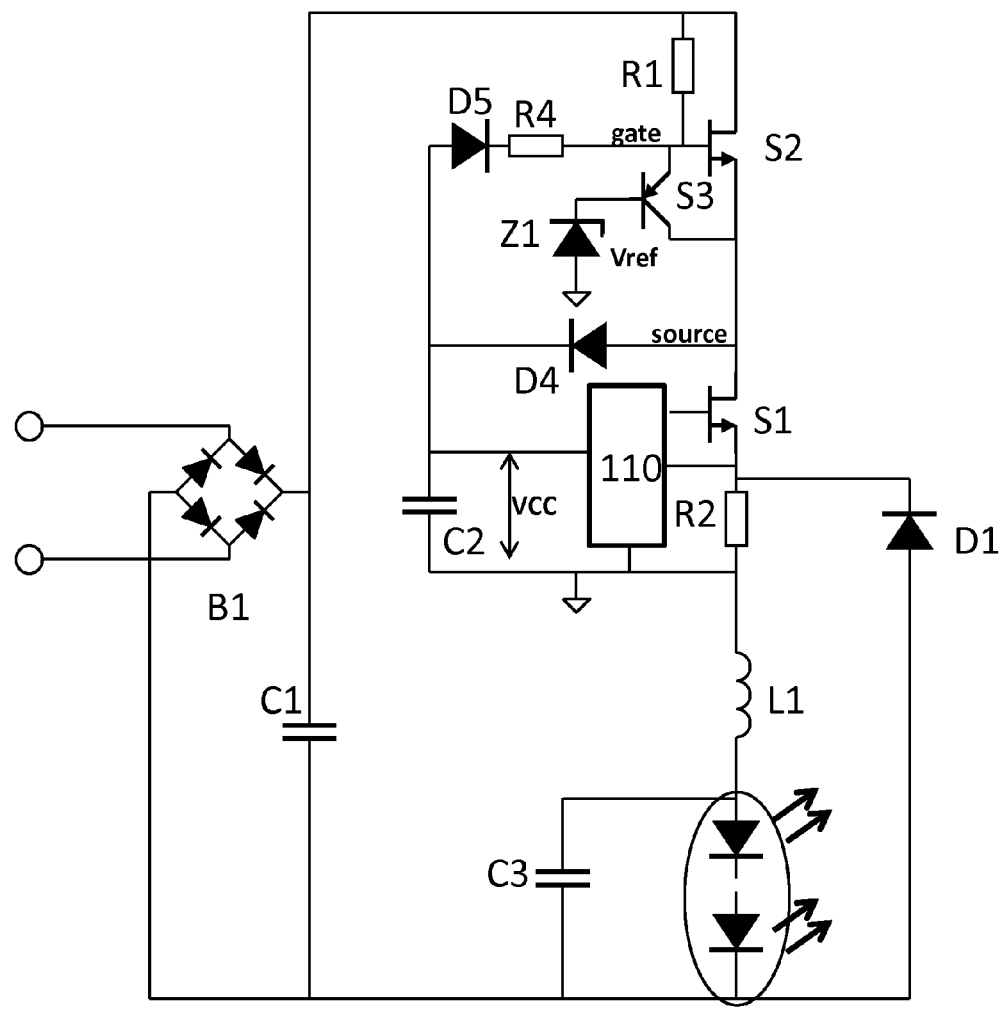
Figure 15A:
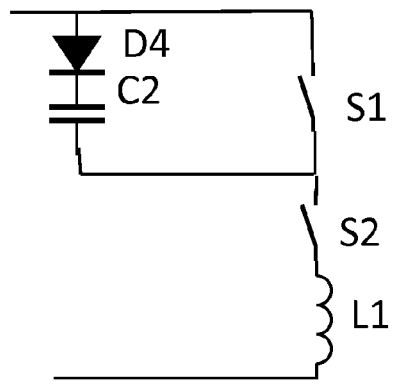
FIGS. 15a-15f illustrate other example arrangements of a power switch, control switch, and inductor, and with associated current paths for charging a capacitor.
Figure 15B:
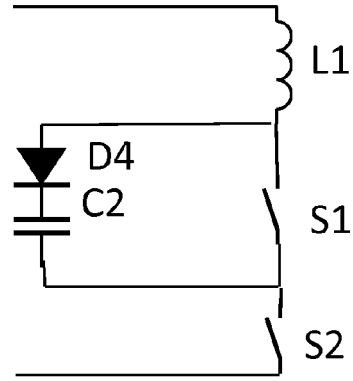
Figure 15C:
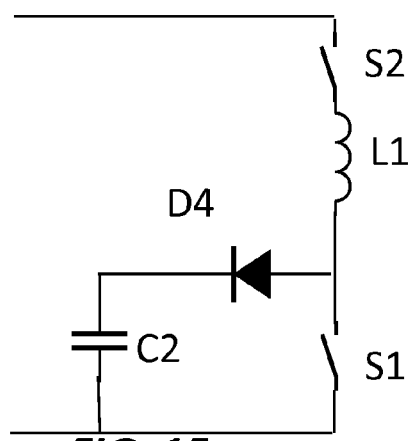
Figure 15D:
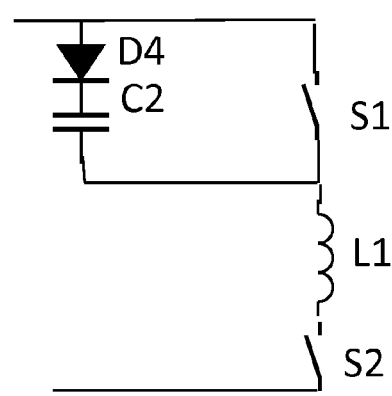
Figure 15E:
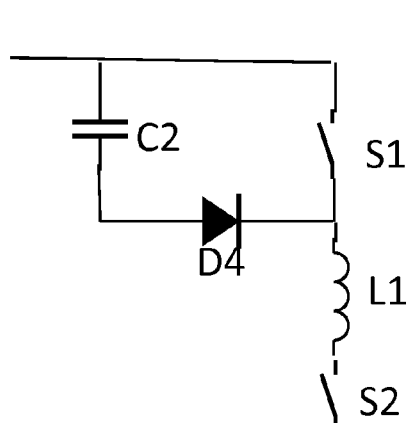
Figure 15F:
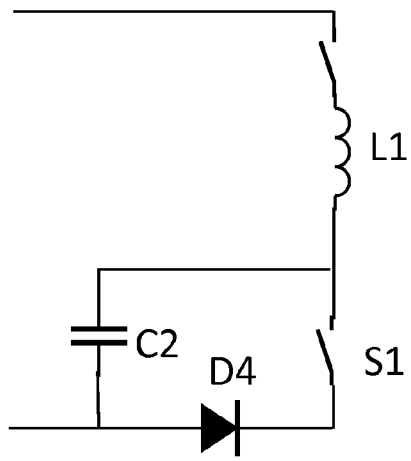

As has already been mentioned, embodiments may make use of a MOSFET rather than a bipolar transistor for the power switch S2. Two examples of such embodiments are shown in FIG. 12 and FIG. 13. The circuit shown in FIG. 12 is similar to that shown in FIG. 9, except that S2 is implemented as a MOSFET, rather than a bipolar device. Now the gate charge of S2 is used to keep S2 conductive in time interval t1-t2. For a circuit with a MOSFET it may be appropriate to include D5: without D5 the discharge of the gate charge during t1-t2 might be too high, which could result in that S2 is switched off prematurely.

FIG. 13 illustrates another embodiment in which S2 is implemented as a MOSFET. In this embodiment, start-up resistor R1 is reconnected to the gate of S2. In this embodiment, during start-up the gate of S2 is pulled up by R1 to the zener reference voltage, (Vref), plus the base-emitter voltage (Vbe(S3)) of S3. During start-up S2 works as a linear regulator, supplying the capacitor C2 via diode D4. Because S2 is now a MOSFET with a high impedance gate, R1 can be made very high ohmic—10 MΩ or more, resulting in a very low dissipation in R1 and a high efficiency.

FIG. 14a shows the series arrangement of the power and control switches S2 and S1 and inductor L1, together with the first current path including it diode D4, which charges the capacitor C2 during interval t1 to t2, according to embodiment shown in the previous figures. However, in other embodiments of the switches and inductors may be arranged differently; for instance as shown in FIG. 14b, the switches may be on the "low side" of the inductor L1. The skilled person will be aware that most commonly n-type transistors are used for each of the power switch and control switch; however, the present disclosure is not limited to n-type switches. Arrangements for the first current path, in the case that the switches are p-type transistors corresponding to those in FIG. 14a and FIG. 14b, for high side switching and low side switching respectively, are shown in FIG. 14c and FIG. 14d. In each case the capacitor C2 is charged through diode D4 during the time period when control switch S1 is open but power switch S2 is closed.

Finally, it will be appreciated that the ordering of the components of the series arrangement of inductor, control switch and power switch may be different to those shown in FIGS. 14a-14d. Although the arrangements of FIGS. 14a-14d are generally considered to be the most efficient layout of the series arrangements, others are possible and not excluded, for example the inductor may be between the two switches. Some of these arrangements, and the corresponding first current paths to charge the capacitor C2, are shown in FIGS. 15a-15f.

Whereas the embodiments described above have been illustrated with reference to a lighting circuit, and a string of LEDs in particular, it will be appreciated that the present disclosure is not limited thereto, and other embodiments may be associated with may comprise other forms of lighting, such as OLED or electroluminescent, or other loads which are not associated with lighting at all, but maybe without limitation motors, actuators, sensors, heating elements or other electrical loads.

Furthermore, embodiments are not limited to buck converter configurations. Illustratively, other embodiments may be linked with boost, buck-boost, of flyback configurations. The implementation for such other converter types will be immediately apparent to the skilled person, and do not require any modifications to the relevant parts of the circuit.

Embodiments have been described in which the duration of period t1-t2 is determined by the time it takes for the voltage on the capacitor C2 to reach a threshold voltage. Other embodiments may include a time-limiting circuit, which limits the duration of the t1-t2 interval in the event that C2 does not charge quickly enough—for instance due to a temporary heavy load in the controller. Such a circuit may force the connection switch S3 (or S4 as the case may be) to close at the end of a predetermined period, in the event that the threshold voltage has not been reached.

From reading the present disclosure, other variations and modifications will be apparent to the skilled person. Such variations and modifications may involve equivalent and other features which are already known in the art of switched mode power supplies, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims [delete if not relevant] and reference signs in the claims shall not be construed as limiting the scope of the claims.

The invention claimed is:

1. A switched mode power supply for converting an input voltage and comprising:
   a series arrangement of an inductor, a power switch and a control switch for controlling the power switch;
   a controller configured to control the control switch and having a supply terminal and a ground terminal;
   a capacitor coupled between the controller ground terminal and supply terminal and for providing power to the controller;
   a first current path arranged to provide charge to the capacitor only when the control switch is open and the power switch is closed;
   a connectable second current path arranged to draw current from the control terminal of the power switch thereby opening the power switch,
   and a connection switch configured to connect the second current path in response to a voltage across the capacitor exceeding a threshold voltage.

2. A switched mode power supply according to claim 1, wherein the power switch is a bipolar junction transistor and the current drawn from the control terminal of the power switch is provided by a base charge of the transistor in an on-state.

3. A switched mode power supply according to claim 2, further comprising a further current path through the base of the power switch thereby enabling a start-up of the switched mode power supply.

4. A switched mode power supply according to claim 1, wherein the power switch is a MOSFET.

5. A switched mode power supply according claim 1, wherein the second current path is a recycling path arranged to draw current from the control terminal of the power switch to charge the capacitor.

6. A switched mode power supply according to claim 1, wherein the current path arranged to provide charge to the capacitor when the power switch is closed comprises a diode.

7. A switched mode power supply according to a claim 1, being a buck converter and arranged for connection of a load in series with the series arrangement.

8. A switched mode power supply according to claim 1, being a boost converter and arranged for connection of a load in parallel with the control switch and power switch in series.

9. A switched mode power supply according to claim 1, being a flyback converter wherein the inductor is a primary winding of a transformer, and arranged for connection of a load to a secondary winding of the transformer.

10. A lighting circuit compromising a switched mode supply according to and of claim 7 and the load, wherein the load is a string of LEDs.

11. A lighting circuit according to claim 10, wherein the input voltage is a rectified and smoothed mains voltage.

12. A method of controlling a switched mode power supply comprising a series arrangement of a power switch, a control switch and an inductor, the arrangement being connected across a positive and a negative terminal of an input voltage; a controller having a supply terminal and a ground terminal; and a capacitor coupled between a ground terminal and a supply terminal of the controller and for providing power to the controller;
   the method comprising;
   operating the controller to periodically open and close the control switch;
   providing charge to the capacitor through a first current path only when the control switch is open and the power switch is closed; and
   in the event that a voltage across the capacitor exceeds a threshold voltage, operating a connection switch to connect a second path thereby drawing current from the control terminal of the power switch thereby opening the power switch.

13. The method of claim 12, wherein the power switch is a bipolar junction transistor,
   and wherein drawing current from the control terminal of the power switch discharges a base charge of the transistor in an on-state.

14. The method of claim 12, wherein current drawn from the control terminal of the power switch is used to charge the capacitor.

15. The method of claim 12, further comprising providing a start-up current to the control terminal of the power switch during a start-up phase of the switched mode power converter, thereby providing start-up energy to the capacitor.

* * * * *